United States Patent
Amano et al.

(10) Patent No.: US 10,195,697 B2
(45) Date of Patent: Feb. 5, 2019

(54) PALLADIUM (PD)-COATED COPPER WIRE FOR BALL BONDING

(71) Applicant: TANAKA DENSHI KOGYO K.K., Kanzaki-gun, Saga-ken (JP)

(72) Inventors: Hiroyuki Amano, Saga-ken (JP); Somei Yarita, Saga-ken (JP); Yusuke Sakita, Saga-ken (JP); Yuki Antoku, Saga-ken (JP); Wei Chen, Saga-ken (JP)

(73) Assignee: TANAKA DENSHI KOGYO K.K., Kanzaki-Gun, Saga-Ken (JP)

( * ) Notice: Subject to any disclaimer, the term of this patent is extended or adjusted under 35 U.S.C. 154(b) by 0 days.

(21) Appl. No.: 15/248,196

(22) Filed: Aug. 26, 2016

(65) Prior Publication Data

US 2017/0057020 A1    Mar. 2, 2017

(30) Foreign Application Priority Data

Sep. 2, 2015 (JP) .................. 2015-172778

(51) Int. Cl.
*B21C 1/02* (2006.01)
*B23K 35/02* (2006.01)
(Continued)

(52) U.S. Cl.
CPC ............ *B23K 35/0227* (2013.01); *B21C 1/02* (2013.01); *B23K 35/302* (2013.01);
(Continued)

(58) Field of Classification Search
CPC . H01L 2224/45664; H01L 2224/45147; H01L 2224/05624; H01L 2924/01014; H01L 2924/01029; H01L 2224/45; H01L 2224/45015; H01L 2224/45565; H01L 2924/00011; H01L 2924/00012; H01L 2924/01004; H01L 2924/01005;
(Continued)

(56) References Cited

U.S. PATENT DOCUMENTS 8,247,911 B2    8/2012  Uno et al.
8,815,019 B2    8/2014  Uno et al.
(Continued)

FOREIGN PATENT DOCUMENTS

JP    S60-160554 U    10/1985
JP    2004-014884 A    1/2004
(Continued)

OTHER PUBLICATIONS

Machine translation of WO 2016189752 (translated Jan. 26, 2018) (Year: 2016).*
(Continued)

*Primary Examiner* — David Sample
*Assistant Examiner* — Elizabeth Collister
(74) *Attorney, Agent, or Firm* — Manabu Kanesaka

(57) ABSTRACT

A palladium coated copper wire for ball bonding includes a core formed of pure copper or copper alloy having a purity of 98% by mass or more, and a palladium draw coated layer coated on the core. The copper wire has a diameter of 10 to 25 μm, and the palladium drawn layer contains sulfur, phosphorus, boron or carbon.

7 Claims, 2 Drawing Sheets
(2 of 2 Drawing Sheet(s) Filed in Color)

(51) Int. Cl.
*C22C 9/00* (2006.01)
*C22C 9/06* (2006.01)
*B23K 35/30* (2006.01)
*B32B 15/01* (2006.01)
*C22C 5/02* (2006.01)
*C22C 5/04* (2006.01)
*C22F 1/08* (2006.01)
*C22F 1/14* (2006.01)
*C23C 14/16* (2006.01)
*C23C 14/35* (2006.01)
*C23C 26/00* (2006.01)
*C25D 3/50* (2006.01)

(52) U.S. Cl.
CPC .............. *B32B 15/018* (2013.01); *C22C 5/02* (2013.01); *C22C 5/04* (2013.01); *C22C 9/00* (2013.01); *C22C 9/06* (2013.01); *C22F 1/08* (2013.01); *C22F 1/14* (2013.01); *C23C 14/165* (2013.01); *C23C 14/35* (2013.01); *C23C 26/00* (2013.01); *C25D 3/50* (2013.01); *H01L 2224/05624* (2013.01); *H01L 2224/45* (2013.01); *H01L 2224/45015* (2013.01); *H01L 2224/45147* (2013.01); *H01L 2224/45565* (2013.01); *H01L 2224/45664* (2013.01); *H01L 2924/00011* (2013.01); *H01L 2924/10253* (2013.01)

(58) Field of Classification Search
CPC .......... H01L 2924/01006; H01L 2924/01015; H01L 2924/01016; H01L 2924/01028; H01L 2924/01078; H01L 2924/01201; H01L 2924/013; H01L 2924/20752; H01L 2924/10253; B21C 1/02; B23K 35/0227; B23K 35/302; B32B 15/018; C22C 5/02; C22C 5/04; C22C 9/00; C22C 9/06; C22F 1/08; C22F 1/14; C23C 14/165; C23C 14/35; C23C 26/00; C25D 3/50

See application file for complete search history.

(56) References Cited

U.S. PATENT DOCUMENTS

| | | | | |
|---|---|---|---|---|
| 2012/0118610 | A1* | 5/2012 | Terashima | ............... C22C 5/02 |
| | | | | 174/126.2 |
| 2017/0040281 | A1* | 2/2017 | Oyamada | ............... B32B 15/20 |
| 2017/0200690 | A1* | 7/2017 | Yamada | ............... H01L 24/45 |

FOREIGN PATENT DOCUMENTS

| | | |
|---|---|---|
| JP | 2010-272884 A | 12/2010 |
| JP | 2011-146754 A | 7/2011 |
| JP | 2011-249463 A | 12/2011 |
| JP | 2012-036490 A | 2/2012 |
| JP | 2013-042105 A | 2/2013 |
| JP | 2013-110261 A | 6/2013 |
| JP | 2014-232762 A | 12/2014 |
| WO | 2010/106851 A1 | 9/2010 |
| WO | WO-2016189752 A1 * | 12/2016 ............ H01L 24/45 |

OTHER PUBLICATIONS

SCI Technical Review, Jul. 2006, No. 169, Ingenious Dynamics, Sumitomo.

Japan Patent Office, "Office Action for Japanese Patent Application No. 2015-172778," dated Apr. 26, 2016.

China Patent Office, "Office Action for Chinese Patent Publication No. 201610730700.5," dated Jun. 5, 2018.

* cited by examiner

PALLADIUM (PD)-COATED COPPER WIRE FOR BALL BONDING

RELATED APPLICATIONS

The present application is based on, and claims priority from, Japanese Application No. JP2015-172778 filed Sep. 2, 2015, the disclosure of which is hereby incorporated by reference herein in its entirety.

BACKGROUND OF THE INVENTION AND RELATED ART STATEMENT

The present invention relates to a palladium (Pd)-coated copper wire for ball bonding, the wire being suitable for connecting an IC chip electrode to an external lead or the like on a substrate in a semiconductor device. More specifically, the present invention relates to an extra fine palladium (Pd)-coated copper wire having a diameter of 10 to 25 μm and capable of giving a stable molten ball.

Generally, a process called ball bonding is employed for the first bonding of a coated copper bonding wire to an electrode, and a process called wedge bonding is employed for the second bonding of the coated copper bonding wire to wiring on a semiconductor circuit wiring board. In the first bonding, a discharge current in an electronic-flame-off (EFO) process is used to apply arc input heat to the tip of the coated copper bonding wire. In the EFO process, in general, an angle formed between the tip of the bonding wire and the tip of a discharge torch is 60 degrees or less with respect to the longitudinal direction of the wire. In the process, arc discharge is formed between the tips of the discharge torch and the wire, a molten ball portion is formed at the tip of the bonding wire and the ball portion is connected to an aluminum pad on an electrode.

The tip portion of the bonding wire is molten to form the ball, and thereafter surface tension is utilized to solidify its molten item. Specifically, at the tip of the molten bonding wire, a sphericity called a free air ball (FAB) is formed. Then, while the initial ball and the electrode are being heated at a temperature of 150 to 300° C., ultrasonic waves are applied, and thus the initial ball and the electrode are crimped and are thereby bonded to the aluminum pad on a chip.

Here, the FAB refers to a molten ball that is formed at the tip of the bonding wire by performing spark discharge on the tip of the bonding wire while spraying a non-oxidizing gas such as nitrogen or nitrogen-hydrogen or a reducing gas to the tip of the coated copper bonding wire which is extended out from the tip of a bonding tool. Examples of the material of the aluminum pad include 99.99% by mass or more of pure aluminum (Al), an alloy of aluminum (Al)-1% by mass of silicon (Si), an alloy of aluminum (Al)-0.5% by mass of copper (Cu) and an alloy of aluminum (Al)-1% by mass of silicon (Si)-0.5% by mass of copper (Cu).

Conventionally, as a bonding wire for connecting an IC chip electrode to an external lead in a semiconductor device, a palladium (Pd)-coated copper wire is used. For example, Japanese Utility Model Application Publication No. Sho 60-160554 proposes "a bonding fine wire for a semiconductor comprising a coating layer made of Pd or a Pd alloy directly or via an intermediate layer on the outer periphery of a core wire made of Cu or a Cu alloy." Thereafter, as a practical palladium (Pd)-coated copper wire, as disclosed in Japanese Patent Application Publication No. 2004-014884 (Patent Literature 1 which will be described later), "a bonding wire which includes a core and a coating layer formed on the core, in which the core is formed of a material, other than gold, having a micro Vickers hardness of 80 Hv or less and in which the coating layer is formed of a metal whose melting point is 300° C. or more higher than that of the core and whose oxidation resistance is more excellent than that of copper" was developed.

On 47 and the subsequent pages of SEI Technical Review magazine No. 169 published in July, 2006, in a paper titled "Development of Hybrid Bonding Wire" (Non Patent Literature 1 which will be described later) written by Kaimori Shingo et al., "a plating-coated wire which is coated with 0.1 μm of an oxidation-resistant metal and which has the diameter of 25 μm" is introduced. A patent application on the analysis of an interface between the core and the coating layer thereof (Japanese Patent Application Publication No. 2010-272884) is also filed.

In these palladium (Pd)-coated copper wires, as seen in photograph 5 on page 50 in Non Patent Literature 1, on a surface in the vicinity of the root of the molten ball, palladium (Pd) particles are dispersed, and thus a wire loop is stabilized. In the palladium (Pd)-coated copper wires, palladium (Pd) fine particles from a palladium (Pd) drawn layer are dispersed in the molten ball. Hence, it is said that even when in the interface between the molten ball and the aluminum pad, an intermetallic compound of aluminum (Al) and copper (Cu) is produced, the growth rate of the intermetallic compound is lowered as compared with a case of a gold bonding wire.

However, since the conventional palladium (Pd) drawn layer is thinner than the copper (Cu) of the core, most of the palladium (Pd) particles are embedded in the molten ball so as to be formed into an alloy. Hence, although it is known that the palladium (Pd) fine particles function to prevent the formation of an Al—Cu intermetallic compound in the interface with the aluminum pad, the palladium (Pd) fine particles only slightly contribute to the prevention in the interface.

Hence, Japanese Patent Application Publication No. 2013-42105 (Patent Literature 2 which will be described later) proposes an invention of "a bonding wire where on the core of copper and inevitable impurities, a coating layer is formed whose cross-sectional area is 0.1 to 1.0% of the total of the cross-sectional area of the wire and which is formed of Pd" (claim 1 in the publication described above). In a photograph of the surface of the molten ball in FIG. 2a(C) of the publication described above, it is indicated that "Pd (black points) are spread over the FAB (ball b)."

However, the shape of the surface of a core wire or a coated core wire is constantly changed by the wear of a diamond die, and the shape of a cross-sectional surface of the tip of a coated copper wire when the coated copper wire is torn by the second bonding is also constantly changed. Hence, it is extremely difficult to leave the palladium (Pd) fine particles in the thin palladium (Pd) drawn layer on the surface of the molten ball when the FAB is formed. Thus, it is required that the structure of a bonding wire in which even when the FAB is formed 10 or more times for one second, the palladium (Pd) particles can be uniformly dispersed on the molten copper ball and which is suitable for the mass production.

CITATION LIST

[Non Patent Literature 1] "Development of Hybrid Bonding Wire" written by Kaimori Shingo et al. on 47 and the subsequent pages of SEI Technical Review magazine No. 169 published in July, 2006.

Patent Literature

[Patent Literature 1] Japanese Patent Application Publication No. 2004-014884
[Patent Literature 2] Japanese Patent Application Publication No. 2013-42105

An object of the present invention is to provide a palladium (Pd)-coated copper wire for ball bonding in which even when the shape of the surface of a core wire is changed by the wear of a diamond die, palladium (Pd) particles can be uniformly dispersed on a molten copper ball and which is suitable for the mass production.

SUMMARY OF THE INVENTION

In a palladium (Pd)-coated copper wire for ball bonding that is formed so as to solve the problem in the present invention, the palladium (Pd)-coated copper wire for ball bonding has a diameter of 10 to 25 μm, a palladium (Pd) drawn layer is formed on a core formed of a copper alloy in which the purity of pure copper (Cu) or copper (Cu) is 98% by mass or more and the palladium (Pd) drawn layer is a palladium (Pd) layer which contains sulfur (S), phosphorus (P), boron (B) or carbon (C).

In another palladium (Pd)-coated copper wire for ball bonding that is formed so as to solve the problem in the present invention, the palladium (Pd)-coated copper wire for ball bonding has a diameter of 10 to 25 μm, a palladium (Pd) drawn layer and a gold (Au) ultra-thin drawn layer are formed on a core formed of a copper alloy in which the purity of pure copper (Cu) or copper (Cu) is 98% by mass or more and the palladium (Pd) drawn layer is a palladium (Pd) layer which contains sulfur (S), phosphorus (P), boron (B) or carbon (C).

BRIEF DESCRIPTION OF THE DRAWINGS

The patent or application file contains at least one drawing executed in color. Copies of this patent or patent application publication with color drawing (s) will be provided by the Office upon request and payment of the necessary fee.

DETAILED DESCRIPTION OF PREFERRED EMBODIMENTS

Figure 1:
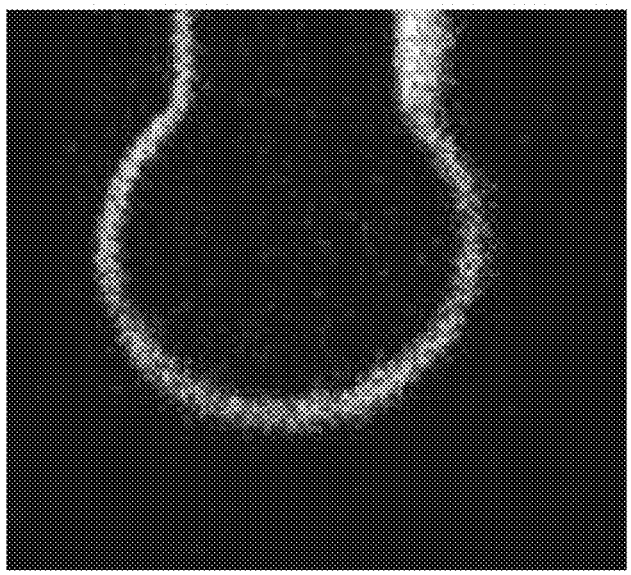
FIG. 1 is a photograph of distribution of palladium (Pd) in a cross section of the bonding wire of the present invention.

The copper alloy preferably contains 0.1 to 1.5% by mass of platinum (Pt) or nickel (Ni). The palladium (Pd) drawn layer preferably has a theoretical film thickness which is 30 nanometers (nm) or more and 300 nanometers (nm) or less. The palladium (Pd) drawn layer is preferably a plating precipitate from a wet plating bath. The palladium (Pd) drawn layer is preferably a eutectoid of sulfur (S) or phosphorus (P). A total of 30 to 700 mass ppm (0.2 to 800 mass ppm in a case where only phosphorus (P) is contained) of at least one type or two types or more of sulfur (S), phosphorus (P), boron (B) and carbon (C) is preferably contained in the palladium (Pd) drawn layer. 30 to 300 mass ppm of sulfur (S) is particularly preferably contained in the palladium (Pd) drawn layer. Preferably, on the front surface side of the palladium (Pd) drawn layer, the sulfur (S) is concentrated, and on the side of the core, the sulfur (S) is equal to or less than a detection limit. The film thickness of the sulfur (S) in a direction of depth thereof is preferably greater than the film thickness of the gold (Au) ultra-thin drawn layer in a direction of depth thereof. The gold (Au) ultra-thin drawn layer preferably has a theoretical film thickness which is 3 nanometers (nm) or less.

In the present invention, the palladium (Pd) drawn layer is used so that a contained element of sulfur (S), phosphorus (P), boron (B) or carbon (C) is uniformly dispersed in the palladium (Pd) layer. The contained elements can be preferably contained in the palladium (Pd) layer by wet plating or dry plating or molten salt plating. Crystal grains are drawn by intense wire drawing processing with a diamond die, and mechanical high strain occurs over the crystal grains. The high strain state is somewhat alleviated by final heat processing, and thus the palladium (Pd)-coated copper wire for ball bonding is completed.

In the present invention, the palladium (Pd) drawn layer and the gold (Au) ultra-thin drawn layer are used so that the palladium (Pd) layer is sandwiched between the gold (Au) layer and the core and that the intense wire drawing processing is performed to uniformly disperse the contained element contained in the palladium (Pd) layer. Normally, the gold (Au) layer is more satisfactory in malleability than the palladium (Pd) layer. However, in a case where the gold (Au) layer is an ultra-thin drawn layer, even when the theoretical film thickness is equal to or less than the atomic radius of gold (Au), since the gold (Au) particles are present, the gold (Au) layer can be considered to follow the palladium (Pd) layer during the intense wire drawing processing.

Here, the "theoretical film thickness" refers to a film thickness that is calculated with the assumption that the cross section of the bonding wire before and after the intense wire drawing processing is a full circle and that it is uniformly coated with the gold (Au) or the palladium (Pd) of its wire diameter. The "theoretical film thickness" is a conception that is used because since the shape of the surface of the core wire or the coated core wire is changed by the wear of the diamond die and thus the film thickness of the gold (Au) ultra-thin drawn layer or the like in the uppermost surface is extremely thin, it is impossible to measure it.

For example, the proportion of the gold (Au) in the entire bonding wire is determined by chemical analysis with a gravimetric analysis method. The film thickness calculated from the determined value with the assumption that the cross section of the bonding wire is a full circle and that the uppermost surface of its wire diameter is uniformly coated with the gold (Au) is the theoretical film thickness. The case where the palladium (Pd) drawn layer is thin is likewise supported. On the nanoscale order, since projections and recesses are present in the actual surface of the bonding wire, the value of the theoretical film thickness may be lower than the atomic radius of Au. With respect to the expression of the gold (Au) ultra-thin drawn layer or the palladium (Pd) drawn layer in the uppermost surface, for convenience, the range where the fine particles of the gold (Au) or the palladium (Pd) are present is expressed by the "layer".

In the present invention, the palladium (Pd) drawn layer is a palladium (Pd) layer which contains sulfur (S), phosphorus (P), boron (B) or carbon (C) so that the distance between the palladium (Pd) fine particles is first increased to bring the palladium (Pd) into a state of dispersed fine particles. The predetermined contained element is preferably interposed between the palladium (Pd) fine particles precipitated from a liquid phase rather than a gas phase. Since as the chemical activity is increased, the thermal diffusion rate of the contained element is increased, thermal processing or the intense wire drawing processing is performed on the palladium (Pd) drawn layer, with the result that it is possible to delay the growth of the palladium (Pd) fine particles caused by thermal diffusion. Secondly, when the FAB is formed, the contained elements interact with the surface of copper (Cu) before interacting with the palladium (Pd), and thus the dissolution of the palladium (Pd) fine particles into molten copper (Cu) is inhibited. Consequently, it is possible to leave the palladium (Pd) fine particles on the surface of the molten copper (Cu).

The reason for this can be considered as follows. The palladium (Pd) drawn layer on which the intense wire drawing processing has been performed is higher in chemical reactivity than the core formed of the copper alloy in which the purity of pure copper (Cu) or copper (Cu) is 98% by mass or more. Hence, even in the final thermal processing whose temperature is lower than a temperature at which the copper (Cu) in the core and the palladium (Pd) in the drawn layer diffuse into each other, the contained element surrounding the palladium (Pd) fine particles thermally diffuses much earlier than the palladium (Pd) to facilitate the formation of the palladium (Pd) fine particles. The platinum (Pt) or nickel (Ni) in the copper alloy does not thermally diffuse into the palladium (Pd) drawn layer.

Hence, when the molten ball is formed from the bonding wire, the contained element surrounding the palladium (Pd) fine particles is quickly passed out to individually form the palladium (Pd) fine particles. Then, the palladium (Pd) fine particles of high melting point are dispersed and can be floated on the molten copper ball. On the other hand, it can be considered that the contained element is present in the interface between the copper (Cu) and the palladium (Pd), and thus the interface is modified into a chemically inert state. In particular, the contained element is preferably sulfur (S).

In the present invention, the gold (Au) ultra-thin drawn layer in the uppermost surface can be provided. In the present invention, when the gold (Au) ultra-thin drawn layer is provided, the gold (Au) ultra-thin drawn layer can stabilize a discharge current in an (EFO) process. Furthermore, it can be considered that sulfur (S), phosphorus (P), boron (B) or carbon (C) thermally diffuses, by the final thermal processing, into the gold (Au) ultra-thin drawn layer which is high in chemical reactivity, and thus the surface of the palladium (Pd)-coated copper wire is modified into a chemically inert state. Hence, the film thickness of the contained element in the direction of depth thereof is preferably larger than the film thickness of the gold (Au) ultra-thin drawn layer in the direction of depth thereof. In particular, sulfur (S) is preferable. In this way, the gold (Au) ultra-thin drawn layer is brought into an inert state, and thus it is possible to leave the palladium (Pd) fine particles on the surface of copper (Cu).

The intensity of the function of the contained element on the palladium (Pd) fine particles is indicated by sulfur (S)>phosphorus (P)>boron (B)·carbon (C). The sulfur (S) or phosphorus (P) of low melting point has a greater function of modifying the surface of the copper (Cu) to reduce the movement of copper (Cu) atoms. In particular, the sulfur (S) whose surface activity is high modifies the surface of the copper (Cu) in the core the most significantly.

The effect of the contained elements on the palladium (Pd) fine particles can be understood as follows. The palladium (Pd) in the plating bath is present in the state of divalent ions, is then brought into a zero-valent state on the surface of the core of the copper (Cu) and is precipitated as the metal of palladium (Pd). Then, the metal of palladium (Pd) precipitated is flocculated to form the palladium (Pd) fine particles. In a series of steps described above, when the ions of the contained element are present together in the plating bath, and the palladium (Pd) is brought from the state of divalent ions into the zero-valent state, the contained element is simultaneously brought from the state of ions into the zero-valent state, with the result that the palladium (Pd) fine particles of the present invention are easily dispersed. The contained element of the present invention is quickly moved to the surface of the core of the copper (Cu), and thus the diffusion of the palladium (Pd) fine particles into the core of the copper (Cu) is reduced. For example, even when carbon powder is dispersed in the plating path, it is impossible to obtain the effect of the present invention.

With respect to the content of the contained element, a total of 30 to 700 mass ppm (0.2 to 800 mass ppm in a case where only phosphorus (P) is contained) of at least one type or two types or more of sulfur (S), phosphorus (P), boron (B) and carbon (C) is preferably contained in the palladium (Pd) drawn layer. Although it is possible to select, as necessary, the contained element according to the thickness of the palladium (Pd) drawn layer and the method of forming the palladium (Pd) drawn layer, 30 to 300 mass ppm of sulfur (S) is more preferably contained in the palladium (Pd) drawn layer. In particular, 80 to 200 mass ppm of sulfur (S) is preferably contained.

The content of the contained element is determined from a difference between ICP analysis value of the contained element in the entire wire when an additive is put into the plating bath and the ICP analysis value when no additive is put thereinto, and is a concentration which is determined by calculation with the assumption that the total amount of the contained element is uniformly distributed in the theoretical film thickness of the palladium (Pd).

In the present invention, the "coating" layer is a layer which is precipitated from a gas phase or a liquid phase. The layer precipitated from the liquid phase can be formed by wet plating or dry plating. The palladium (Pd) fine particles precipitated from the liquid phase are preferable because its precipitation temperature is lower than that in the gas phase. The wet plating is preferable because the palladium (Pd) fine particles are precipitated at a relatively low temperature of room temperature to 90° C. The wet plating is divided into electrolytic plating and electroless plating, and either of them may be used. In order to finely disperse the palladium (Pd) fine particles, a known additive may be put into the plating bath. This is because the crystal grain diameter is preferably in a close amorphous state.

The contained element can be used as a normal compound together in the palladium (Pd) electrolytic plating bath or the palladium (Pd) electroless plating bath. In this way, eutectoid plating can be performed, and the fine particles in which the contained element is uniformly dispersed on the precipitated palladium (Pd) can be obtained. Furthermore, the palladium (Pd) fine particles which contain the contained element precipitated by wet plating are more preferable because they incorporate hydrogen and thus are more unlikely to be moved.

The contained element can be used in dry plating such as magnetron sputtering either singly or as a palladium (Pd) base alloy. Although in the dry plating, magnetron sputtering or ion plating is more preferable than vacuum deposition, the plating bath is more excellent.

In the present invention, the palladium (Pd) layer which contains sulfur (S), phosphorus (P), boron (B) or carbon (C) may be a palladium (Pd)-sulfur (S), phosphorus (P), boron (B) or carbon (C) alloy layer. This is because although the containing layer can also be obtained by multilayer plating with an alternate layer, the alloy layer is used to obtain the fine palladium (Pd) fine particles when the molten ball is formed.

When in the present invention, a copper alloy which contains 0.1 to 1.5% by mass of platinum (Pt) or nickel (Ni) is used, the diffusion of the copper (Cu) and the palladium (Pd) into each other is reduced, and thus it is possible to further reduce the thickness of the palladium (Pd) drawn layer.

The palladium (Pd) drawn layer preferably has a theoretical film thickness which is 30 nanometers (nm) or more and 300 nanometers (nm) or less because this range is desirable for uniformly dispersing the palladium (Pd) fine particles on the molten ball. In other words, this is because when the thickness is excessively increased, the surface of the core may be excessively modified whereas when the thickness is excessively decreased, the surface of the core may be prevented from being modified.

When the film thickness of gold (Au) by depth profile analysis with an Auger spectroscopy machine is thick enough to be measured, e.g. several hundred nanometers, a so-called a bunch of grapes phenomenon is observed in which the molten ball is wetted over the gold (Au) film on the wire surface present on the root of the molten ball, and the molten ball creeps up onto the unmolten wire surface by the surface tension of the molten ball. However, when the actually measured film thickness of gold (Au) is 50 nanometers (nm) or less and falls within the range of the theoretical film thickness, such a phenomenon is not observed. On the other hand, when the theoretical film thickness of gold (Au) is 50 nanometers (nm) or less, it is difficult to control the film thickness of gold (Au). Hence, the film thickness of gold (Au) is extremely decreased, and thus the thermal diffusion of the contained element is stabilized.

The reason why the gold (Au) ultra-thin drawn layer has the theoretical film thickness which is 3 nanometers (nm) or less is that even when the gold (Au) layer is chemically active, the contained element in the palladium (Pd) drawn layer is moved to reduce the activity. This is because when the gold (Au) layer is extremely thin, the consumed amount of contained element is reduced. Even when the gold (Au) ultra-thin drawn layer has the theoretical film thickness which is 3 nanometers (nm) or less, the FAB is prevented from becoming unstable due to variations in the destination of spark discharge at the time of the formation of the FAB. The gold (Au) ultra-thin drawn layer more preferably has a theoretical film thickness which is 2 nanometers (nm) or less. Even when the gold (Au) ultra-thin drawn layer has the theoretical film thickness which is 2 nanometers (nm) or less, gold (Au) fine particles are scattered on the palladium (Pd) drawn layer. It is thought that since gold (Au) is more excellent in conductivity than palladium (Pd), the spark discharge reaches the gold (Au) fine particles, and thus the FAB is stabilized. The lower limit of the gold (Au) ultra-thin drawn layer is preferably 0.1 nanometers (nm) or more.

In the palladium (Pd)-coated copper wire for ball bonding according to the present invention, a precious metal coating layer formed with the palladium (Pd) drawn layer or the palladium (Pd) drawn layer and the gold (Au) ultra-thin drawn layer is generally 0.5 micrometers (μm) or less, is preferably 0.1 μm or less and is more preferably 0.05 μm or less. Particularly preferably, the palladium (Pd) drawn layer has a theoretical film thickness which is 30 nanometers (nm) or more and 300 nanometers (nm) or less, and the gold (Au) ultra-thin drawn layer has a theoretical film thickness which is 3 nanometers (nm) or less. The film thickness of the precious metal coating layer described above is negligible with respect to the bonding wire diameter of 10 to 25 μm. Hence, when the molten ball is formed with the FAB, it does not depend on the film thickness of the coating layer.

Since the oxidation-resistant palladium (Pd) drawn layer is present, the core is prevented from being, for example, sulfurized by sulfur, chlorine or the like in the atmosphere. Hence, as with the composition of the core formed of a known copper alloy in which the purity of copper (Cu) is 99.9% by mass or more, the molten ball is formed in the shape of a sphericity, and thus the palladium (Pd)-coated copper wire for ball bonding according to the present invention is bonded to the aluminum pad.

The copper alloy of the core is generally a copper alloy which is formed of copper (Cu) whose purity is 99.9% by mass or more. When in the copper alloy which is formed of copper (Cu) whose purity is 99.9% by mass or more, phosphorus (P) is selected, for the remaining metal components other than those, the contained element can be determined as necessary with consideration given to alloys in the known conventional technology. However, a copper alloy base material is more preferably a copper alloy which contains 0.1 to 1.5% by mass of platinum (Pt) or nickel (Ni). This is because sulfur (S), phosphorus (P), boron (B) or carbon (C) is contained in the palladium (Pd) drawn layer, and thus the palladium (Pd) fine particles can be dispersed on the surface of the molten copper ball.

For the copper alloy of the core, the type of element added is determined as necessary according to the type and application of semiconductor required, and a combination of elements added or the added amount can be determined as necessary according to thermal and mechanical properties required as the bonding wire.

It is known that phosphorus (P) is present in the copper (Cu) of the core, and thus it is possible to form the stable FAB (Japanese Patent Application Publication No. 2010-225722 and International Publication No. WO2011/129256). Hence, the copper alloy can contain 20 mass ppm or more and 200 mass ppm or less of phosphorus (P).

The ultra-thin palladium (Pd) drawn layer or the ultra-thin palladium (Pd) drawn layer and the gold (Au) ultra-thin drawn layer present on the wire surface in the present invention disappear when the FAB in the first bonding is bonded to the aluminum pad. When ultrasonic bonding is performed in the second bonding, they also disappear in the place of the bonding.

Advantageous Effects of Invention

According to the palladium (Pd)-coated copper wire for ball bonding in the present invention, on the surface of the FAB, the palladium (Pd) fine particles can be uniformly dispersed. Hence, even in the mass-produced bonding wire, the first bonding on the aluminum pad with the FAB is stabilized. Since the palladium (Pd) fine particles are finely dispersed in the interface of the bonding between the aluminum pad and the copper ball without fail, it is possible to delay the formation of an Al—Cu intermetallic compound. Since the palladium (Pd) drawn layer is thin, even when sulfur (S) is contained in the palladium (Pd) drawn layer, the total amount of sulfur (S) in the bonding wire is substantially equal to the amount of sulfur (S) contained in the core.

Furthermore, at the time of wedge bonding in the second bonding, since the palladium (Pd) fine particles are bonded to a lead while being dispersed due to the presence of the contained element, the wedge bonding is stabilized.

According to the palladium (Pd)-coated copper wire in the present invention, the entrance of oxygen from the surface of the wire is interrupted by the palladium (Pd) layer which contains sulfur (S), phosphorus (P), boron (B) or carbon (C). As the palladium (Pd) drawn layer is more finely formed, it is possible to obtain an effect of preventing the formation of an oxide film of a copper oxide on the copper alloy of the core as compared with a conventional pure palladium (Pd) layer. Since in the palladium (Pd)-coated copper wire for ball bonding according to the present invention, the coating layer is extremely thin, it is possible to satisfactorily perform the formation of a loop or the like.

Furthermore, in a case where the gold (Au) ultra-thin drawn layer is formed in the uppermost surface of the wire, the discharge current is stabilized, and moreover, even when the wires are wounded multiple times, the wires are prevented from being attached. Consequently, it is easier to unwind the wires. As an incidental effect, the slip of a capillary on the surface of the wire is facilitated. According to the palladium (Pd)-coated copper wire in the present invention, the gold (Au) ultra-thin drawn layer in the uppermost surface of the wire is prevented from being separated from the coating layer. Hence, even when the bonding is repeatedly performed multiple times, an oxide of copper (Cu) is prevented from being adhered to the capillary, with the result that the capillary is prevented from being contaminated.

EXAMPLES

As the core, a core obtained by adding platinum (Pt), nickel (Ni) or phosphorus (P) to copper (Cu) whose purity was 99.9999% by mass or more or a core without the addition was used, and the core was continuously cast, was rolled while subjecting to previous heat processing, was thereafter primarily drawn into a wire, with the result that a thick wire (diameter of 1.0 mm) was obtained.

Then, a palladium (Pd) drawn layer and a gold (Au) ultra-thin drawn layer shown in table 1 were prepared, and the outer circumference of the thick wire was coated with them. The purity of the gold (Au) in the ultra-thin drawn layer was 99.99% by mass or more, and the purity of the palladium (Pd) was 99.9% by mass or more.

Examples 1 to 3

A coating layer of a palladium (Pd)-sulfur (S) amorphous alloy was formed as follows. To a commercially available palladium (Pd) electroplating bath (ADP700 made by Japan Electro Plating Co., Ltd.), 0.1 g/L, 0.005 g/L and 0.15 g/L of ADP700 additive made by the company were individually added, and thus the concentration of sulfur (S) in the plating bath was set medium, low and high. In this plating bath, a current whose current density was 0.75 A/dm$^2$ was passed through the copper wire having the diameter of 1.0 mm, and the coating layer of the palladium (Pd)-sulfur (S) amorphous alloy was formed. These three types coated copper wires were coated with gold (Au) by magnetron sputtering such that the gold (Au) had a predetermined thickness.

Thereafter, baking processing was not performed, continuous secondary wire drawing was performed under wet conditions with a diamond die, refining heat processing was performed at 480° C. for one second and palladium (Pd)-coated copper wires for ball bonding having the diameter of 18 μm were finally obtained. They were referred to as examples 1 to 3. The average shrinkage diameter rate was 6 to 20%, and the final linear velocity was 100 to 1000 m/minute.

Example 4

A coating layer of a palladium (Pd)-phosphorus (P) amorphous alloy was formed as follows. To a commercially available palladium (Pd) electroless plating bath (ADP700 made by Japan Electro Plating Co., Ltd.), 0.2 g/L of phosphorous acid ($H_3PO_3$) was added. In this plating bath, a current whose current density was 0.75 A/dm$^2$ was passed through the copper wire having a diameter of 1.0 mm, and the coating layer of the palladium (Pd)-phosphorus (P) amorphous alloy was formed. Thereafter, as with example 1, a palladium (Pd)-coated copper wire for ball bonding in example 4 was manufactured.

Example 5

A coating layer of an alloy containing palladium (Pd)-carbon (C)-boron (B) was formed as follows. To the commercially available palladium (Pd) electroplating bath (ADP700 made by Japan Electro Plating Co., Ltd.), 2 mL/L of a surfactant (JS wetter made by Nippon Electro Plating Co., Ltd.) and a predetermined amount of boron inorganic compound were added. In this plating bath, a current whose current density was 0.75 A/dm$^2$ was passed through the copper wire having the diameter of 1.0 mm, and the coating layer of the alloy containing palladium (Pd)-carbon (C)-boron (B) was formed. Thereafter, as with example 1, a palladium (Pd)-coated copper wire for ball bonding in example 5 was manufactured.

TABLE 1

| No. | Core 4N Cu | Core Added element | Drawn layer Pd (nm) | Ultra-thin drawn layer Au (nm) | Contained element concentration in wire S concentration (mass ppm) | Contained element concentration in wire P concentration (ppm) | Contained element concentration in wire C concentration (ppm) | Contained element concentration in wire Others (ppm) | Contained element concentration in Pd film (Theoretical value) | HAST Test |
|---|---|---|---|---|---|---|---|---|---|---|
| Example 1 | Remaing part | Pt 0.5 mass % | 50 | 2 | 3 | 0.1 | 10 | — | S 170 ppm | ○ |
| Example 2 | Remaing part | Ni 1 mass % | 280 | 3 | 8 | 0.1 | 10 | — | S 100 ppm | ○ |

TABLE 1-continued

| | Core | | Drawn layer Pd (nm) | Ultra-thin drawn layer Au (nm) | Contained element concentration in wire | | | | Contained element concentration in Pd film (Theoretical value) | HAST Test |
|---|---|---|---|---|---|---|---|---|---|---|
| No. | 4N Cu | Added element | | | S concentration (mass ppm) | P concentration (ppm) | C concentration (ppm) | Others (ppm) | | |
| Example 3 | Remaing part | Pt 0.2 mass % + Ni 1.2 mass % | 100 | 1 | 10 | 0.1 | 10 | — | S 300 ppm | ○ |
| Example 4 | Remaing part | None | 40 | — | 0.5 | 6 | 10 | — | P 500 ppm | ○ |
| Example 5 | Remaing part | P 0.02 mass % | 70 | 2 | 0.5 | 200 | 16 | B 6 | C 300 ppm + B 300 ppm | ○ |
| Comparative example 1 | Remaing part | None | 60 | 10 | 0.5 | 0.1 | 10 | — | — | X |
| Comparative example 2 | Remaing part | None | 40 | — | 0.5 | 0.1 | 10 | As 20 | — | X |
| Comparative example 3 | Remaing part | P 1 mass % | 70 | 0.1 | 0.5 | 10,000 | 10 | — | — | X |

Here, with respect to the values of the palladium in the drawn layer and the gold in the ultra-thin drawn layer shown in table 1, about 1000 m of the wire having a diameter of 18 μm was dissolved in aqua regia, the concentrations of gold (Au) and palladium (Pd) in the solution were determined by high-frequency inductively coupled plasma emission spectroscopy (ICPS-8100 made by Shimadzu Corporation) and the values were calculated from the concentrations as the uniform film thickness in the diameter of the bonding wire. In other words, they are corresponding values in the chemical analysis of ICP.

With respect to the sulfur (S) contained the wires in examples 1 to 3, about 100 m thereof was individually dissolved in aqua regia, and the concentration of the sulfur (S) in the solution was determined with an inductively coupled plasma mass spectrometer (Agilent 8800 made by Agilent Technologies Co., Ltd.).

The concentration of the sulfur (S) in the palladium (Pd) drawn layer was determined as follows. Specifically, the ICP analysis value of the sulfur (S) when the ADP700 additive was not added to the commercially available palladium (Pd) electroplating bath in example 1 is 0.5 mass ppm as indicated in examples 4 and 5. On the other hand, the ICP analysis value of the sulfur (S) when the ADP700 additive was added in example 1 is 3 mass ppm. Since the film thickness of the palladium (Pd) drawn layer is 50 nm, when it is assumed that a substantial increase of 2.5 mass ppm in the sulfur (S) caused by the additive in example 1 was all uniformly contained in the palladium (Pd) drawn layer, the theoretical concentration of the sulfur (S) is 170 mass ppm.

About 100 m of the wire in example 4 was dissolved in aqua regia, and the concentration of sulfur (S) in the solution was determined with the inductively coupled plasma mass spectrometer (Agilent 8800 made by Agilent Technologies Co., Ltd.). 500 m and about 1 g of the wire in example 5 was taken, and the concentration of carbon (C) was determined by a combustion method (CS844 made by LECO Corp.). The results thereof are shown in middle columns of table 1.

When the bonding wire in example 1 was subjected to elemental analysis on the elements of palladium (Pd), copper (Cu), gold (Au) and sulfur (S) in the direction of depth thereof with a scanning Auger analysis device (MICRO-LAB-310D made by VG Corp.), a sulfur (S) layer having a long distance was detected as compared with a gold (Au) layer, and it was shorter than the length of the palladium (Pd) layer. In other words, it can be understood that the palladium (Pd) layer precipitated in the plating bath was the drawn layer of a palladium (Pd) particle group in which the sulfur (S) was more likely to be removed.

Then, in the bonding wire in example 1, an arch discharge voltage was increased to 6000 volts with a fully automatic bonder ICONN ProCu-type ultrasonic device made by K & S Corp. to form 1000 molten balls of 34 μm. When the entire uppermost surface thereof was subjected to qualitative analysis with the scanning Auger analysis device (MICRO-LAB-310D made by VG Corp.), the palladium (Pd) was uniformly distributed on the surface of the balls. A cross-sectional photograph of the molten ball is shown in FIG. 1. As is clear from FIG. 1, it is found that with the palladium (Pd)-sulfur (S) electroplating alloy layer of the present invention, the palladium (Pd) was uniformly dispersed on the molten ball.

In the palladium (Pd)-coated copper wire for ball bonding in the other examples 2 to 5, as with example 1, it was observed that the palladium (Pd) was uniformly dispersed on the molten ball.

(Corrosion Test on Intermetallic Compound)

With respect to the wires in examples 1 to 5, with a fully automatic ribbon bonder ICONN-type ultrasonic device made by K & S Corp., on the pad of an Al-1% by mass of Si-0.5% by mass of Cu alloy with a thickness of 2 μm on an Si chip having a thickness of 400 μm on a BGA substrate, molten balls of 34 μm were produced with an EFO current of 60 mA for an EFO time of 144 μs, and 1000 wires were bonded with the crimp diameter of 50 μm and the loop length of 2 mm. Here, in the pad of the Al-1% by mass of Si-0.5% by mass of Cu alloy, only bond portions adjacent to each other were electrically connected, the wires adjacent to each other electrically form one circuit and a total of 500 circuits were formed. Thereafter, the Si chip on the BGA substrate was sealed with resin with a commercially available transfer molding machine (GP-PRO-LAB80 made by Dai-ichi Seiko Co., Ltd.).

The samples (examples 1 to 5) were held with a HAST device (PC-R8D made by Hirayama Manufacturing Corp.) at 130° C.×85 RH (relative humidity) for 200 hours. Before and after the holding, the electrical resistance values of the 500 circuits described above were measured, and the results thereof are indicated in the right columns of table 1 such that a case where at least one circuit was present in which the electrical resistance value after the holding exceeded 1.1 times the electrical resistance value before the holding is represented by x whereas a case where in all the 500 circuits, the resistance values were less than 1.1 times the resistance value is represented by 0.

As is clear from the results of the HAST test described above, it is found that in all examples 1 to 5 of the present invention, the resistance values were less than 1.1 times the resistance value in all the 500 circuits.

COMPARATIVE EXAMPLES

As compared with example 1, a coating layer of palladium (Pd) was formed from a commercially available palladium bath to which sulfur (S) was not added. Thereafter, as in example 1, gold (Au) was applied by magnetron sputtering, and bonding wires formed in example 1 were referred to as comparative examples 1 and 3. Likewise, a bonding wire which was formed by applying no gold (Au) and adding a predetermined amount of arsenic (As) inorganic compound to a commercially available palladium bath was referred to as comparative example 2.

About 100 m of the wire in comparative example 1 was dissolved in aqua regia, and the concentration of sulfur (S) in the solution was determined with the inductively coupled plasma mass spectrometer (Agilent 8800 made by Agilent Technologies Co., Ltd.). About 100 m of the wire in comparative example 2 was dissolved in aqua regia, and the concentration of sulfur (S) in the solution was determined with the inductively coupled plasma mass spectrometer (Agilent 8800 made by Agilent Technologies Co., Ltd.). 500 m and about 1 g of the wire in comparative example 3 was taken, and the concentration of carbon (C) was determined by the combustion method (CS844 made by LECO Corp.). The results thereof are shown in middle columns of table 1. The concentrations of added elements in a palladium film were determined from differences in the concentrations of the added elements between the wires to which these additives were added and the wires to which these additives were not added, and the results thereof are shown in middle columns of table 1.

Figure 2:
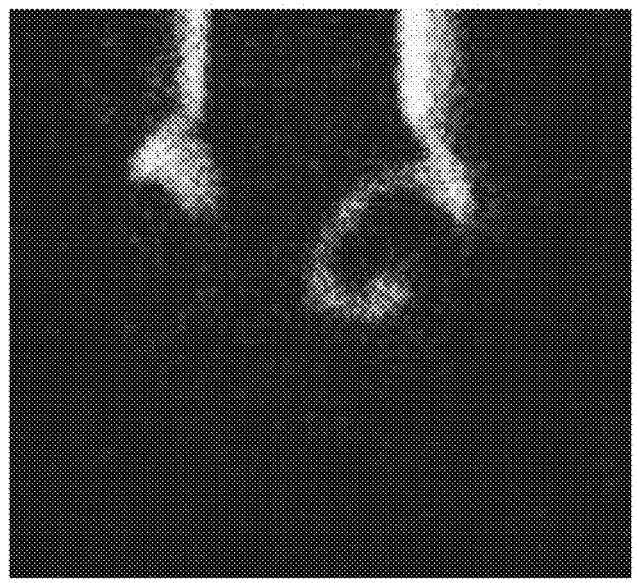
FIG. 2 is a photograph of distribution of palladium (Pd) in a cross section of a conventional bonding wire.

As with example 1, molten balls were produced from the bonding wire in comparative example 1. A cross-sectional photograph of the molten ball is shown in FIG. 2. As is clear from FIG. 2, it is found that in the palladium (Pd)-coated copper wire in comparative example 1, a small turbulence was produced on the right side of the root portion of the wire and that palladium (Pd) fine particles were molten into the molten ball. In other words, since a small turbulence is constantly changed depending on conditions, this indicates that it is impossible to uniformly disperse the palladium (Pd) on the molten ball.

As with example 1, the bonding wires in comparative examples 1 and 3 were subjected to elemental analysis on the elements of palladium (Pd), copper (Cu), gold (Au) and sulfur (S) in the direction of depth thereof with the scanning Auger analysis device (MICROLAB-310D made by VG Corp.), a sulfur (S) layer corresponding to the thickness of a gold (Au) layer was only detected. In the palladium (Pd) layer where the gold (Au) layer was not present in comparative example 2, sulfur (S) was not detected. In other words, the palladium (Pd) layer is a drawn layer of the palladium (Pd) fine particles which was kept drawn.

(Corrosion Test on Intermetallic Compound)

With respect to the wires in comparative examples 1 to 3, as with examples 1 to 5, variations in the electrical resistance values of the circuits before and after the holding of a high temperature and a high humidity (130° C.×85 RH) were checked. It is found that since the wires in comparative examples 1 to 3, the electrical resistance values of the circuits were increased, they were not suitable for bonding wires. The results thereof were represented by x in the right columns of table 1.

INDUSTRIAL APPLICABILITY

The palladium (Pd)-coated copper wire for ball bonding in the present invention is applied, instead of conventional gold alloy wires, not only to general-purpose ICs, discrete ICs and memory ICs but also to semiconductors such as IC packages for LEDs and automobile semiconductor IC packages in which low costs are required even in a high temperature and a high humidity.

What is claimed is:

1. A palladium coated copper wire for ball bonding, comprising:
   a core formed of pure copper or copper alloy having a purity of 98% by mass or more, and
   a palladium drawn coated layer of an eutectoid of sulfur or phosphorus coated on the core,
   wherein the copper wire has a diameter of 10 to 25 μm, and
   the palladium drawn coated layer contains the sulfur or the phosphorus in an amount of 30-700 mass ppm.

2. The palladium coated copper wire according to claim 1, further comprising a gold drawn coated layer coated on the palladium drawn coated layer.

3. The palladium coated copper wire according to claim 1, wherein the copper alloy contains 0.1 to 1.5% by mass of platinum or nickel.

4. The palladium coated copper wire according to claim 1, wherein the palladium drawn coated layer has a theoretical film thickness of 30 nm or more and 300 nm or less.

5. The palladium coated copper wire according to claim 1, wherein the palladium drawn coated layer is a drawn layer of a plating precipitate from a wet plating bath.

6. A palladium coated copper wire for ball bonding, comprising:
   a core formed of pure copper or copper alloy having a purity of 98% by mass or more, and
   a palladium drawn coated layer coated on the core,
   wherein the copper wire has a diameter of 10 to 25 μm,
   the palladium drawn coated layer contains sulfur, phosphorus, boron or carbon, and
   30 to 300 mass ppm of the sulfur is contained in the palladium drawn coated layer.

7. A palladium coated copper wire for ball bonding, comprising:
   a core formed of pure copper or copper alloy having a purity of 98% by mass or more, and
   a palladium drawn coated layer coated on the core,
   wherein the copper wire has a diameter of 10 to 25 μm,
   the palladium drawn coated layer contains sulfur, phosphorus, boron or carbon, and
   the palladium drawn coated layer has a sulfur concentrated portion on an outer surface side, and a portion where sulfur is equal to or less than a detection limit on a core side.

* * * * *